United States Patent [19]

Alfano et al.

[11] Patent Number: 5,003,168
[45] Date of Patent: Mar. 26, 1991

[54] TRIGGER CIRCUIT FOR A STREAK CAMERA SWEEP DRIVE CIRCUIT

[76] Inventors: Robert R. Alfano, 3777 Independence Ave., Bronx, N.Y. 10463; Rohana Garuthara, 2610 Glenwood Rd., Brooklyn, N.Y. 11210

[21] Appl. No.: 288,481

[22] Filed: Dec. 22, 1988

[51] Int. Cl.⁵ .............................................. H01J 31/50
[52] U.S. Cl. ........................... 250/213 VT; 250/211 J
[58] Field of Search ............. 250/213 VT, 211 J, 551; 357/30; 313/525, 542, 529

[56] References Cited

U.S. PATENT DOCUMENTS

| | | | |
|---|---|---|---|
| 3,917,943 | 11/1975 | Auston | 250/211 J |
| 4,282,427 | 8/1981 | Brjukhnevich et al. | 250/213 VT |
| 4,301,362 | 11/1981 | Mourou | 250/211 J |
| 4,327,285 | 4/1982 | Bradley | 250/213 VT |
| 4,413,178 | 11/1983 | Mourou et al. | 250/213 VT |
| 4,431,914 | 2/1984 | Mourou et al. | 250/213 VT |
| 4,438,331 | 3/1984 | Davis | 250/211 J |
| 4,645,918 | 2/1987 | Tsuchiya et al. | 250/213 VT |
| 4,661,694 | 4/1987 | Corcoran | 250/213 VT |
| 4,695,733 | 9/1987 | Pesavento | 250/211 J |
| 4,714,825 | 12/1987 | Oba | 250/213 VT |
| 4,781,442 | 11/1988 | Koster et al. | 250/211 J |
| 4,822,991 | 4/1989 | Riggs et al. | 250/211 J |

Primary Examiner—David C. Nelms
Assistant Examiner—Michael Messinger
Attorney, Agent, or Firm—Irving M. Kriegsman

[57] ABSTRACT

A trigger circuit for use in providing a trigger pulse to a sweep drive circuit in a streak camera. The trigger circuit comprises a low voltage DC power supply, a resistor, a charge line and a photodetector switch all connected in series. The photodetector switch includes a slab of a semi-insulating semiconductor material which becomes photoconductive when actuated by optical radiation. In use, the trigger circuit is coupled to the sweep drive circuit of the streak camera. In the absence of optical radiation, the switch is nonconducting and a voltage from the DC power supply builds up in the charge line. When the switch is actuated by optical radiation it becomes closed causing the voltage to be discharged to the sweep drive circuit. The switch returns to a nonconducting state (i.e. an open state) after about 1.5 nanoseconds.

14 Claims, 2 Drawing Sheets

TRIGGER CIRCUIT FOR A STREAK CAMERA SWEEP DRIVE CIRCUIT

BACKGROUND OF THE INVENTION

The present invention relates generally to streak cameras and more particularly to a trigger circuit for producing a trigger pulse for triggering the sweep drive circuitry in a streak camera.

Streak cameras are about fifteen years old in the art and have been used hitherto, primarily, to directly measure the time dynamics of luminuous events, i.e., to time resolve light pulses. A typical streak camera comprises an entrance slit, input relay optics, a streak camera tube having disposed therein a photocathode, an accelerating mesh, sweeping electrodes, electron multiplication means and a phosphor screen, sweep drive circuitry (including a sweep voltage generator) for driving the sweeping electrodes, accellerating means for accellerating electrons emitted from the photocathode to the phosphor screen, and output-relay optics. The operation of a streak camera is as follows: A light pulse is projected onto the entrance slit. The slit-image of the incident pulse of light is then focused on the photocathode of the streak camera tube via the relay lens. The photocathode converts the pulse of light focused thereon into electrons which are then emitted therefrom. The electrons are then accelerated from the photocathode, through the accelerating mesh and, thereafter, into a deflection field established between the sweeping electrodes. Once in the deflection field, the electrons are swept at high speed in a direction perpendicular to the slit length. To ensure that all of the electrons will be deflected during their passage between the sweep electrodes, the arrival of the deflection voltage at the sweep electrodes is synchronized with the arrival of the emitted electrons thereat. After being deflected by the sweep electrodes, the electrons are multiplied, typically by a microchannel plate. Electrons exiting the microchannel plate then bombard the phosphor screen of the streak tube and are converted into an optical image (called a "streak image").

As a result of this sturcture and the sweeping system used, the time at which the electrons are released from the photocathode surface can be determined by measuring their degree of deflection (vertical position on the phosphor screen). Therefore, the time axis of the incident light corresponds to the vertical axis on the phosphor screen, and the intensity of the incident light can be determined by the density of the streak image.

Since it is necessary that the timing of the high speed deflection be synchronized with the arrival time of electrons at the sweep electrodes, streak cameras very often split the pulse of light into two pulses. The first pulse or luminescence emitted from a device when excited by the first pulse is focused on the photocathode in the manner described above. The pulse will ultimately go on to form the image. The second pulse is directed to a light sensitive switch which is usually in the form of a PIN photodiode detector. When the second pulse impinges upon the PIN photodiode detector, a voltage signal of intensity proportional to the second pulse is emitted therefrom. This voltage signal is used to trigger the transmission of a deflection voltage from the sweep drive circuitry to the sweep electrodes.

In U.S. Pat. No. 4,645,918 issued to Tsuchiya et al., there is disclosed an instrument, including a streak camera, for time resolving successive light pulses generated at a high repetition rate. The streak camera disclosed includes a PIN photodiode detector which is used to synchronize the arrival of the deflection voltage at the sweep electrodes with the arrival of the emitted photoelectrons. The synchronization works as follows: The pulse of light to be examined is split into first and second pulses. The first pulse is focused on the photocathode, which converts the first pulse into emitted electrons which are then accelerated towards the sweep electrodes. The second pulse is directed to a PIN photodiode. The PIN photodiode generates pulse currents in response to the second pulse of light, which impinges thereon. The output of the PIN photodiode is then amplified by an amplifier and sent to a delay circuit. After propagating through the delay circuit, whose variable path length is the determinant of the degree of delay, the signal is sent to a tuned amplifier where another voltage is generated. This voltage, which in turn is amplified by a drive amplifier, is then transmitted to the sweep electrodes for defection of the electrons passing therebetween.

In U.S. Pat. No. 4,661,694 issued to Corcoran, there is disclosed a streak camera having a plate of nonlinear non-phase-matchable material in combination with a photocathode of high sensitivity to visible radiation which renders the streak camera capable of time resolving infrared incident pulses. Synchronization of the deflection field with the arrival of the photoelectrons is similarly accomplished by means of a PIN photodiode which converts the infrared pulse being tested into a trigger signal used to activate a sweep voltage generator coupled to the sweep electrodes.

In U.S. Pat. No. 4,327,285 issued to Bradley, there is disclosed a streak camera for use in time resolving repetitive optical phenomena of picosecond or faster duration. In one embodiment of the invention, synchronization of the deflection field with the arrival of photoelectrons thereat is achieved by detecting the light pulses with a photo-detector and then feeding an electrical output signal therefrom to a sync circuit to lock the driving voltage from a signal generator to the pulse train.

One problem common to the above described streak cameras is their susceptibility to a phenomenon known as trigger jitter, which results in the projection of successive streak images produced at a high repetition rate on the phosphor screen at different loci. Because the successive streak images are often projected into the phosphor screen at different places, averaging of successive streak images is frequently made very difficult (or even impossible where the streak image is projected outside of the phosphor screen). Trigger jitter is caused by the inherent fluctuations in the amplitudes of most light pulse sources. Lasers, for instance, are known to fluctuate in amplitude by more than a factor of two or three. The reason why this fluctuation in amplitude results in trigger jitter in all of the above described streak cameras is that all of the synchronization systems make use of a PIN photodiode as a means for generating trigger pulses. Consequently, when the light pulses of varying amplitude impinge on the photodiode, trigger pulses, which are proportional in intensity to the amplitude of light impinging thereon, are emitted from the PIN photodiode and transmitted to the sweep voltage generator. Because the sweep voltage generators are all keyed to a threshold voltage and because all the trigger pulses from a PIN photodiode have a well defined profile shape and have approximately equal duration, the trigger pulses of greater intensity trigger the voltage generator sooner than trigger pulses of lesser intensity. As a result, the deflection field is established at varying times, depending on the intensity of the voltage pulse up to hundreds of picoseconds.

As noted above, a lack of synchronization between the deflection field and the arrival of photoelectrons at the sweep electrons will result in malalignment of successive streak images. To illustrate the severity of the problem posed by the trigger jitter phenomenon, it is well known in the streak camera art that fluctuations in amplitude of light pulses by more than 20% result in trigger jitter of at least 100 ps, peak to peak.

In U.S. Pat. No. 4,413,178 issued to Mourou et al., there is disclosed a sweep drive circuit for streak camera. The circuit includes a photo-conductive, solid state switch, which when activated by a pulse of light, transmits a high charging sweep voltage derived from a high DC voltage supply (output approximately 2000 volts) directly to the sweep electrodes of the streak camera. As noted, the solid state switch is a part of the sweep drive circuit itself and is not a part of a device itself for providing a trigger pulse to a sweep drive circuit.

One of the limitations of the sweep drive circuit in Mourou is that the sweeping voltage supplied to the deflection plates cannot be varied. As result, the rate at which sweeping occurs is fixed at a specific speed, dependent upon the output of the DC power supply. This is undesirable since changes in the rate of sweeping are often necessary.

It is therefore an object of the present invention to provide a new and improved circuit, suitable for use as a trigger source to the input of the sweep drive circuitry in a streak camera.

It is another object of this invention to provide a circuit as described above which eliminates trigger jitter.

It is another object of the present invention to provide a circuit as described above which does not require the use of a high voltage DC power supply.

It is still another object of the present invention to provide a circuit as described above which is inexpensive to make, which can be mass produced, which can be easily assembled, and which is easy to use.

SUMMARY OF THE INVENTION

A trigger circuit for use as a trigger source in providing a trigger pulse to the sweep drive circuit in a streak camera which is constructed according to the teachings of the present invention, comprises in series a low voltage DC power supply, a resistor, a charge line, and a semi-insulative semiconductor photodetector switch.

In the absence of optical radiation the photodetector switch is non-conducting and a voltage from the DC power supply builds up in the charge line. When the switch is actuated by radiation, the voltage built up in the charge line is discharged through the switch. The output pulse shape is rectangular and is the same from shot to shot. Also the voltage height is the same from shot to shot.

Various features and objects will appear from the description to follow. In the description, reference is made to the accompanying drawings which form a part thereof, and in which is shown by way of illustration, specific embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

BRIEF DESCRIPTION OF THE DRAWINGS

In the drawings wherein like reference numerals represent like parts.

DETAILED DESCRIPTION OF A PREFERRED EMBODIMENT

The present invention is directed to a trigger circuit for use in providing a trigger pulse to the sweep drive circuitry of a streak camera. The principal benefits of the present invention are that highly repetitive trigger pulses which are produced by the circuit are uniform in amplitude, thereby eliminating the problem of trigger jitter. A trigger circuit actually constructed according to this invention resulted in trigger jitter of less than 30 picoseconds.

Although the invention is described with reference to providing trigger pulses to the sweep drive circuitry in a streak camera, it is to be understood; however, that the circuit may if desired, be used to provide trigger pulses to systems and/or circuits other than the sweep drive circuit in a streak camera.

Figure 1:
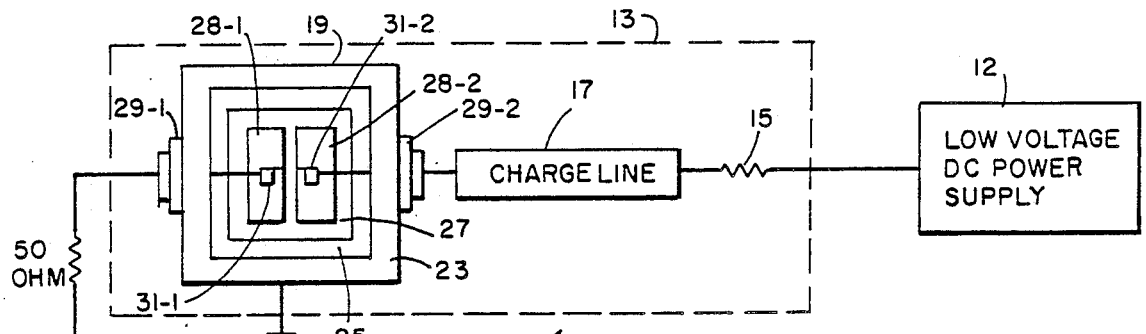
FIG. 1 is a simplified schematic diagram of one embodiment of a trigger circuit constructed according to the teachings of the present invention.

Referring now to FIG. 1, there is disclosed a simplified schematic diagram of a trigger circuit constructed according to this invention for use in providing trigger pulses of uniform intensity and duration, the circuit being identified by reference numeral 11. Circuit 11 includes a low voltage DC power supply 12. The output of DC power supply 12 may be between about 100 to 300 volts. In the embodiment shown, the output of DC power supply is 100 volts. A switch assembly 13 is connected in series to the output 14 of DC power supply 12. Switch assembly 13 includes a resistor 15, a charge line 17, and a semiconductor photodetector switch 19, all connected in series in that order.

Resistor 15, typically has a very high resistance, preferably from 10 k to 100 k ohms. As will become apparent later, the principal function of resistor 15 is to impede the the flow of current obtained from a low voltage DC power supply 12 to charge line 17 so that when switch 19 is closed, charge line 17 will be discharged.

Charge line 17 is preferably constructed of a short coaxial cable 50 ohm transmission line. In the operation of switch assembly 13, charge line 17 receives current from resistor 15 and, in return, builds up an electrical pulse having a voltage V and duration T. Voltage V is proportional to the charge voltage $V_o$, and is typically between 10% and 50% of the charge voltage $V_o$, depending on the switching efficiency. The duration T is equal approximately to 2 L/v where L is the length of the cable and v is the speed of the pulse.

Figure 2:
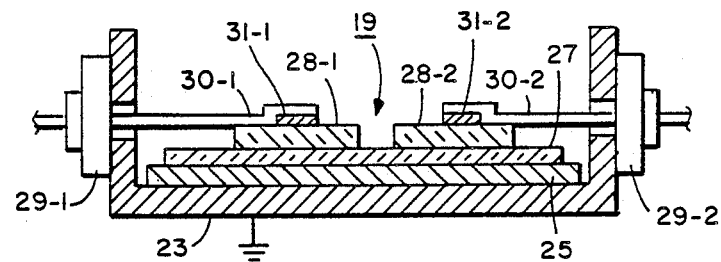
FIG. 2 is an elevation view taken from the front and partly in section of the photodetector switch shown in the trigger circuit in FIG. 1.

Switch 19, is constructed to transmit the voltage pulse built up in charge line 17 when activated by optical radiation. Switch 19 which is also shown in more detail in section in FIG. 2 comprises a conductive metal plate or holder 23, such as brass, which serves primarily as a ground base on which are mounted the functional components of switch 19, which are hereinafter described. A thin sheet of insulative material 25, such a bakelite, teflon, mica or mylar, is fixedly mounted on the top surface of brass holder 23. A slab of semi-insulating semiconductor material 27 which is photoconductive when actuated by optical radiation, such as GaAs doped with chromium or intrinsic silicon, is fixedly mounted on the top surface of insulative material 25. A pair of aluminum-ohmic contacts 28-1 and 28-2, which serve as electrodes, are fixed to the top of slab 27 of photoconductive semiconductor material, spaced apart from one another by a few millimeters. A pair of SMA stripline launchers 29-1 and 29-2 are mounted on holder 23. Each stripline launcher 29-1 and 29-2 includes a conductive tab 30-1 and 30-2, respectively, which is attached to indium contacts 31-1 and 31-2 fixed to contacts 28-1 and 28-2 respectively.

When slab 27 is activated by optical radiation electron pairs and holes are produced which allows current to flow from contact 28-1 through slab 27 to contact 28-2.

A switch assembly as described above has actually been constructed and tested. The tests resulted in jitter of less than 30 ps.

Figure 3:
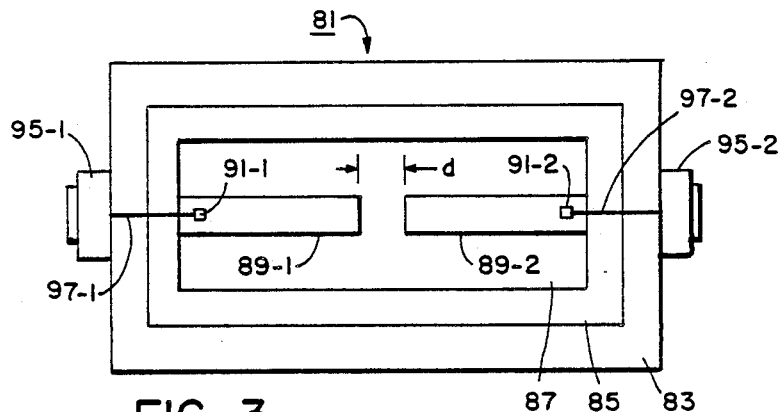
FIG. 3 is plan view of another embodiment of the photodetector switch show in FIG. 2.
Figure 4:
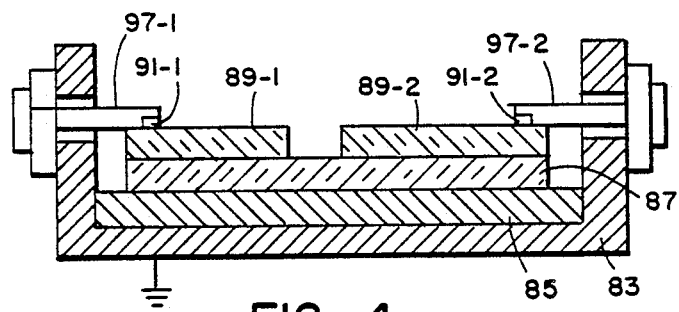
FIG. 4 is an elevation view taken from the front and partly in section of the photodetector switch shown in FIG. 3.

Referring now to FIGS. 3 and 4 there is shown a 50 ohm transmission strip line version of the semiconductor photodetector switch portion of the swtich assembly 13, the switch being identified by reference numeral 81.

Switch 81 includes a metal plate or holder 83, such as brass, which serves as a ground base. A thin sheet of insulative material 85, such as mylar, teflon, mica or bakelite is fixedly mounted on the top surface of plate 83. A slab of semi-insulating semiconductor material 87 which is photoconductive when actuated by optical radiation, such as GaAs doped with chromium or ontrinsic silicon is fixedly mounted on the top surface of insulative material 85. A pair of metal strip lines 89-1 and 89-2, made of a conductive material such as copper and which serve as electrodes, are fixed to the top of the slab of photoconductive semiconductor material 87 and spaced apart from one another by a distance d of 10 microns to 500 microns. A pair of indium contacts 91-1 and 91-2 are attached to strip lines 89-1 and 89-2, respectively. A pair of connectors 95-1 and 95-2, such as for example SMA connectors or K connectors, are mounted on plate 83, one at each end. Each connector 95-1 and 95-2 includes a conductive tab 97-1 and 97-2 which is attached to contacts 91-1 and 91-2, respectively. The thickness of sheet 85, slab 87 and strips 89 are such as to produce a 50 ohm transmission line.

Figure 5:
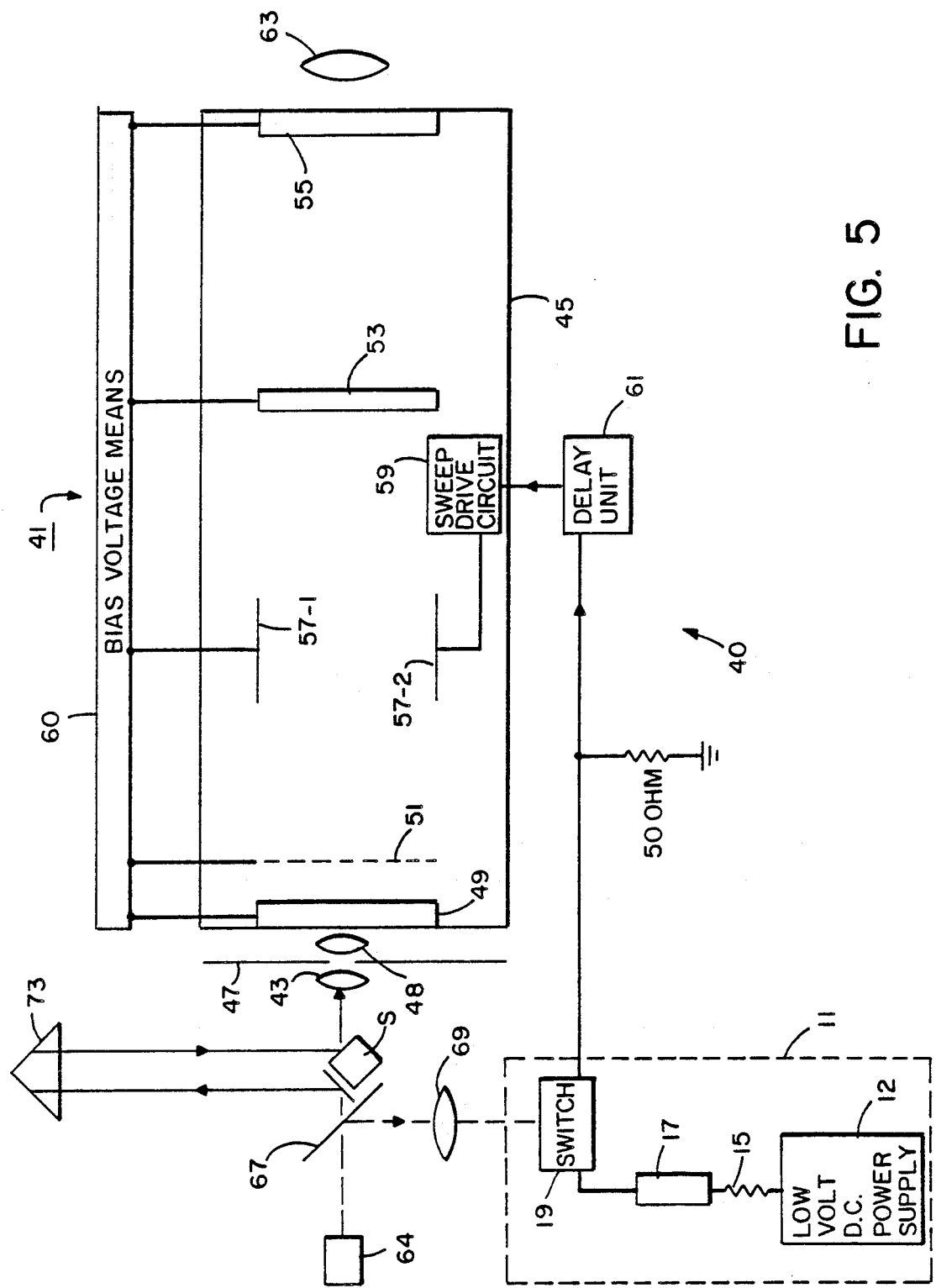
FIG. 5 is a schematic diagram of a streak camera incorporating the trigger circuit of FIG. 1 for triggering the activation of the sweep drive circuitry.

Referring now to FIG. 5, there is shown a streak camera system 40 incorporating switch circuit device 11.

Streak camera system 40 includes a streak camera 41. Streak camera 41 is a typical streak camera insofar as it comprises input optics 43, a streak camera tube 45 having a rectangular entrance slit 47, relay optics 48, a photocathods 49, an accelerating mesh 51, a microchannel plate 53, a phosphor screen 55, deflection electrodes 57-1 and 57-2, a sweep drive circuit 59 including a voltage generator having a variable voltage output, bias voltage means 60, for accellerating electrons through tube 45, a delay unit 61, and output relay optics 63. Streak camera system 40 also includes is a laser light source 64, a low voltage DC power supply 65, a beam splitter 67, focussing optics 69, a mirror 71, an optical dalay 73, and switch circuit 11. Optical delay 73 is positioned to provide an appropriate delay, such as about 30 nanoseconds.

Also shown in FIG. 5 is a sample S which is under examination.

The operation of streak camera system 40 and trigger circuit 11 are as follows: In the absence of a light signal on switch 19, current will flow from resistor 15 and into charge line 17. After a short period of such influx, the current that has flowed into charge line 17 will build into a voltage pulse. However, because switch 19 is open at this point, the voltage pulse built up by charge line 15 cannot be discharged.

When, light source 64 is activated, a pulse of light emitted therefrom will strike beamsplitter 67, where it is split into a transmitted pulse and a reflected pulse. The transmitted pulse is reflected off mirror 71 and optical delay 73 and strikes sample S. The light signal emitted from sample S when illuminated by the transmitted pulse is imaged by optics 43 onto slit 47. Relay optics 48 image slit 47 onto photocathode 49. Upon striking photocathode 49, the light signal is converted into photoelectrons which, subsequently, are expelled from photocathode 49 towards accelerating mesh 51. After being accelerated by mesh 51, the photoelectrons will arrive at deflection electrodes 57-1 and 57-2.

At the same time, the pulse reflected off mirror 67 is focused by lens 69 on photoconductive slab 29 of switch 11, rendering slab 29 conductive by producing electron and hole pairs and as a result, an electrical bridge is formed between contacts 28-1 and 28-2, thereby permitting charge line 17 to discharge the voltage pulse it had built up. After about a few nanoseconds, which is the recombination time of the switch material, switch 19 is returned to its open state. The voltage pulse outputted by switch 19 passes through delay line 61 and, from there, is used to trigger the transmission of a sweep voltage from sweep voltage generator 59 to deflection plates 57-1 and 57-2.

The operation of streak camera 41 from this point onward is no different from that of a typical streak camera as the photoelectrons are swept by deflection electrodes 57-1 and 57-2 onto microchannel plate 53 where electron multiplication occurs. From microchannel plate 53, the electrons continue to travel through streak camera tube 45 until they impinge upon phosphor screen 55, thereby creating a streak image.

As can be appreciated, the voltage pulses generated by device 11 will not vary from pulse to pulse and will not vary according to changes in intensity of the light pulse from laser light source 64. Consequently, trigger jitter is essentially reduced or eliminated.

Moreover, because circuit 11 is used to produce a trigger pulse to trigger sweep voltage generator 59 and is not used directly to bias the deflection plates 57, the intensity of the deflection field and, consequently, the rate at which sweeping occurs may be easily varied.

The embodiments of the present invention are intended to be merely exemplary and those skilled in the art shall be able to make numerous variations and modifications to it without departing form the spirit of the present invention. All such variations and modifications are intended to be within the scope of the present invention as defined in the appended claims.

What is claimed is:

1. In a streak camera system which includes a sweep drive circuit which is activated by an electrical trigger pulse from a trigger circuit, the improvement wherein the trigger circuit comprises:
   (a) a dc power supply,
   (b) a resistor coupled to the output of the dc power supply,
   (c) voltage pulse storage means coupled to the resistor for storing a voltage from the dc power supply, and
   (d) a switch coupled to the voltage pulse storage means for discharging the voltage built up in said voltage pulse storage means, the discharged voltage so produced constituting said electrical trigger pulse, the switch including a slab of semi-insulative semiconductor material which is conductive when illuminated by optical radiation.

2. The trigger invention as recited in claim 1 wherein said switch further comprises:
   (a) a base,
   (b) a layer of insulative material on top of said base and
   (c) a pair of spaced apart electrically conductive elements on top of said slab of semi-insulative semiconductor material,
   (d) said slab of semi-insulative, semiconductor material being on top of said layer of insulative material.

3. The invention as recited in claim 2 wherein said slab of, semi-insulative semiconductor material is intrinsic silicon.

4. The invention as recited in claim 2 wherein said slab of semi-insulating material is gallium arsenide.

5. The invention as recited in claim 1 and wherein the voltage from said dc power supply is between about 100 and 300 volts.

6. The invention as recited in claim 2 and wherein the conductive elements are contacts.

7. The invention as recited in claim 2 and wherein the conductive elements are a pair of metal strips arranged to produce a 50 ohm transmissiom strip line configuration.

8. The invention of claim 7 and wherein the pair of metal strips are spaced apart between 10 and 500 microns.

9. A streak camera system comprising:
   (a) a streak camera tube having disposed therein:
      i. a photocathode for converting light impinging thereon into electrons which are then emitted therefrom,
      ii. a mesh for accelerating electrons from said photocathode,
      iii. a pair of deflection electrodes for deflecting the electrons as a function of time,
      iv. electron multiplication means for increasing the signal generated by the photoelectrons,
      v. a phosphor screen onto which the photoelectrons impinge to create a streak image;
      (vi) accelerating means,
   (b) an electrically activated sweep drive circuit for driving said delection electrodes; and
   (c) a trigger circuit for producing an essentially jitterless voltage pulse for triggering the sweep drive circuit, said trigger circuit comprising:
      i. a dc power supply having a voltage of about 300 volts or less; and
      ii. a switch assembly electrically connected to said low voltage dc power supply, said switch assembly including a resistor, a charge line and a semiconductor photodector switch.

10. The streak camera of claim 9 wherein said electrically activated sweep drive circuit has a variable voltage output.

11. A trigger circuit for streak camera comprising:
    (a) a dc power supply having an output voltage of about 300 volts or less,
    (b) a resistor coupled to the output of the dc power supply,
    (c) voltage pulse storage means coupled to the resistor, and
    (c) a semiconductor photoconductive switch coupled to the voltage pulse storage means.

12. The invention of claim 11 and wherein the voltage pulse storage means comprises a charge line.

13. The invention of claim 12 and wherein the dc power supply has an output of between 100 to 300 volts.

14. The invention of claim 13 and wherein the semiconductor photoconductive switch comprises:
    (a) a slab of photoconductive semiconductor material, and
    (b) a pair of electrical contacts on said slab of photoconductive semiconductor material in spaced apart relationship.

* * * * *